(12) United States Patent
Gamliel

(10) Patent No.: US 6,957,055 B2
(45) Date of Patent: Oct. 18, 2005

(54) DOUBLE BALANCED FET MIXER WITH HIGH IP3 AND IF RESPONSE DOWN TO DC LEVELS

(76) Inventor: Doron Gamliel, Kiryait Blalik, 2700C (IL)

( * ) Notice: Subject to any disclaimer, the term of this patent is extended or adjusted under 35 U.S.C. 154(b) by 467 days.

(21) Appl. No.: 10/078,582

(22) Filed: Feb. 20, 2002

(65) Prior Publication Data

US 2003/0157918 A1 Aug. 21, 2003

(51) Int. Cl.[7] .............................................. H04B 1/26
(52) U.S. Cl. ..................... 455/323; 455/326; 455/333
(58) Field of Search ............................ 455/318, 323, 455/325, 326, 330, 333, 327; 332/103; 375/282, 279; 327/356

(56) References Cited

U.S. PATENT DOCUMENTS

| | | | | |
|---|---|---|---|---|
| 3,913,037 A | * | 10/1975 | Himono et al. ............. 332/175 |
| 4,979,233 A | * | 12/1990 | Kawahata .................... 455/330 |
| 5,006,811 A | * | 4/1991 | Kruger ......................... 329/354 |
| 5,027,163 A | * | 6/1991 | Dobrovolny ................ 455/326 |
| 5,060,298 A | * | 10/1991 | Waugh et al. ............... 455/326 |
| 5,280,648 A | * | 1/1994 | Dobrovolny ................ 455/326 |
| 5,361,409 A | * | 11/1994 | Vice ............................ 455/326 |
| 5,513,390 A | * | 4/1996 | Vice ............................ 455/323 |
| 5,732,345 A | * | 3/1998 | Vice ............................ 455/333 |
| 5,799,248 A | * | 8/1998 | Vice ............................ 455/333 |
| 5,867,072 A | * | 2/1999 | Logothetis .................. 332/103 |
| 6,263,198 B1 | * | 7/2001 | Li ............................... 455/327 |
| 6,278,872 B1 | * | 8/2001 | Poulin et al. ............... 455/333 |
| 6,653,885 B2 | * | 11/2003 | Wu et al. .................... 327/356 |
| 6,807,407 B2 | * | 10/2004 | Ji ................................ 455/326 |
| 2001/0029168 A1 | * | 10/2001 | Yamaguchi .................. 455/73 |
| 2001/0036818 A1 | * | 11/2001 | Dobrovolny ................ 455/326 |
| 2003/0068996 A1 | * | 4/2003 | Setty et al. ................. 455/313 |

* cited by examiner

Primary Examiner—Edward F. Urban
Assistant Examiner—Blane J. Jackson
(74) Attorney, Agent, or Firm—Kevin Redmond

(57) ABSTRACT

A double balanced FET mixer that has a high third order intercept point and an intermediate frequency response that goes to direct current levels. The mixer includes a local oscillator terminal, a RF terminal and an intermediate frequency terminal. The mixer has a pair of field effect transistors. Each field effect transistor has a gate, a drain and a source electrode. The source electrodes of the first and second transistors are connected together. A first balun transformer is connected between the local oscillator terminal and the gates. A second balun transformer is connected between the drains and the RF terminal and the intermediate frequency terminal.

21 Claims, 11 Drawing Sheets

DOUBLE BALANCED FET MIXER WITH HIGH IP3 AND IF RESPONSE DOWN TO DC LEVELS

BACKGROUND OF THE INVENTION

1. Field of the Invention

This invention relates to mixers in general and more particularly to a double balanced mixer that minimizes inter-modulation products, has a high third order intercept point (IP3) and that has an intermediate frequency (IF) response down to direct current (DC) levels.

2. Description of the Prior Art

A mixer circuit converts an RF signal to an intermediate frequency (IF) signal which is the difference of the RF signal and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates intermodulation products due to the non-linearity response. Third order intermodulation products are close in frequency to the fundamental IF frequencies and therefore are difficult to remove by filtering. Third-order intermodulation distortion is a measure of the third-order products generated by a second input signal arriving at the input of a mixer along with the desired signal.

One technique to measure the suppression capability of a mixer is the "third-order intercept" approach. The third-order intercept point is a theoretical point on the RF input versus IF output curve where the desired output signal and third-order products become equal in amplitude as RF input is raised. The high end of the dynamic range of the mixer is defined as the maximum received signal power at which the mixer is designed to be used and is designated the 1 dB compression point or the input signal power level at which the power level of a third order product equals the power level of a fundamental IF signal is called the third order intercept point (IP3). A mixer with a higher IP3 value will have better performance. A mixer is usually specified in terms of input IP3. Output third order intercept point is the difference between input IP3 and conversion loss. Higher conversion losses result in lower output IP3.

Conversion loss is a measure of the efficiency of the mixer in providing frequency translation between the input RF signal and the output IF signal. Conversion loss of a mixer is equal to the ratio of the IF output to the RF input level.

Mixers are typically designed with one of three topologies: single ended, balanced, and double balanced. The double balanced mixers are capable of isolating both the RF signal and the local oscillator LO voltages from the output and thus allow overlap of the RF and IF frequency bandwidths. Several prior art mixer circuits are well known. One mixer design uses a schottky diode quad or ring circuit that uses four diodes with all of the diodes pointed in the same direction. Another mixer circuit is called a star circuit, which uses two diodes pointing toward the central node and two diodes pointing away from the central node. Schottky diode mixers approaching 30 dBm are difficult to tune and are expensive. Diode mixers also require large LO signal levels to obtain a high IP3 which is not practical in many systems.

Another type of mixer uses field effect transistors (FET) as the mixing element instead of a schottky diode. Mixers fabricated using FET's can achieve a higher value of IP3. Unfortunately, mixers using FET's have several other disadvantages such as higher conversion losses and a higher noise figure (conversion losses at 1 dB).

Today's communication receivers operate under multiple frequency carrier environments. Some of these multiple frequency carriers are wanted and some are unwanted. When these frequency carriers are present in a receiver or transmitter simultaneously, they generate inter-modulation products that are unwanted. The level of the inter-modulation products is dictated by the linearity of the mixer in the receiver. The degree of non-linearity of the mixer is measured by IP3. High IP3 mixers are desired for receivers and transmitters operating in multiple carrier environments to minimize third order inter-modulation products.

Mixers with an IF response down to DC levels are particularly useful in low IF mixers, phase detectors and in-phase quadrature (IQ) modulators. IQ modulation is an efficient way to transfer information. IF response down to DC levels is extremely important for mixers used in IQ modulators.

While FET mixers have been used, a current unmet need exists for an improved double balanced FET mixer that has a high third order intercept point and IF response down to DC levels. Another current unmet need is for an improved FET mixer for IQ modulator applications that has an IF response down to DC levels and that can be manufactured at low cost.

SUMMARY OF THE INVENTION

It is a feature of the invention to provide a double balanced mixer for mixing an RF input signal with a local oscillator signal to provide at an output an intermediate frequency signal with a high third order intercept point and an intermediate frequency response that goes to direct current levels.

Another feature of the invention is to provide a double balanced mixer for mixing an RF input signal with a local oscillator signal to provide at an output an intermediate frequency signal with a high third order intercept point and an intermediate frequency response down to direct current levels. The mixer includes a local oscillator terminal, a RF terminal and an intermediate frequency terminal. The mixer has a pair of field effect transistors. Each field effect transistor has a gate, a drain and a source electrode. The source electrodes of the first and second transistors are connected together. A first balun transformer is connected between the local oscillator terminal and the gates. A second balun transformer is connected between the drains and the RF terminal and the intermediate frequency terminal.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention.

BRIEF DESCRIPTION OF THE DRAWINGS

It is noted that the drawings of the invention are not to scale. In the drawings, like numbering represents like elements between the drawings.

DETAILED DESCRIPTION OF THE PREFERRED EMBODIMENT(s)

Figure 1:
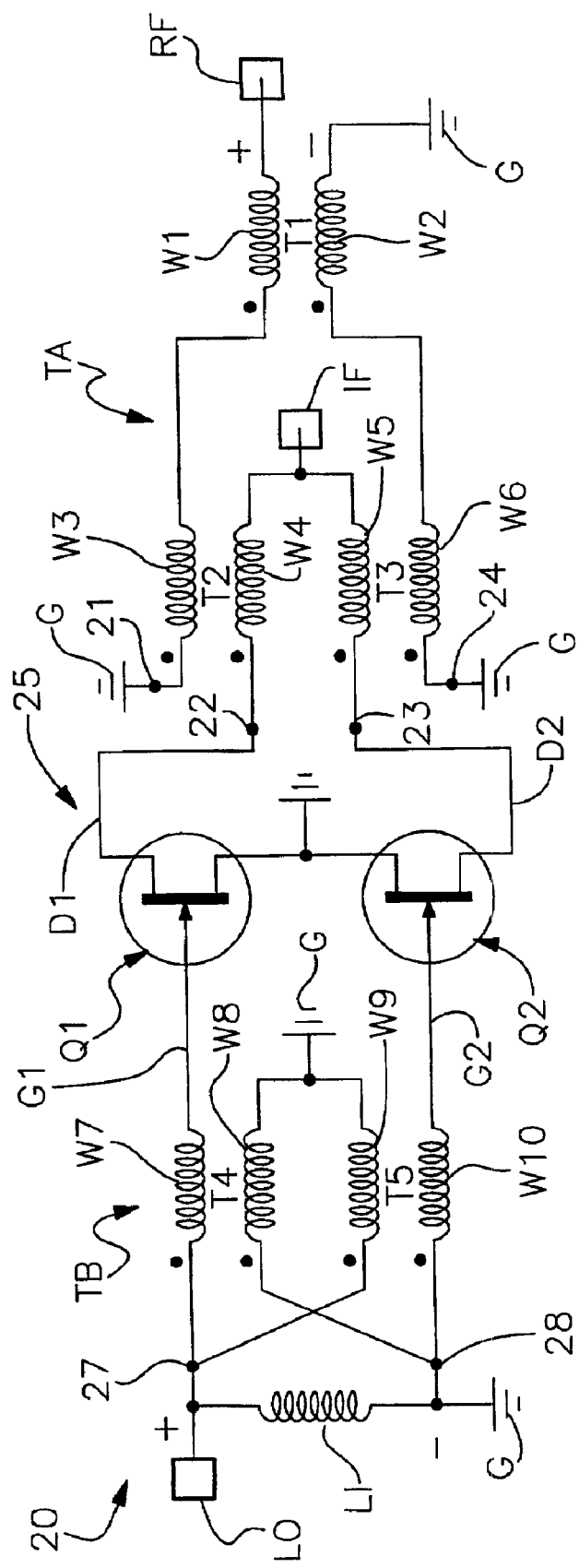
FIG. 1 is a schematic view of a double balanced FET mixer using two FETs.

Referring to FIG. 1, a schematic view of an embodiment of a Double Balanced Mixer according to the present invention is shown. Dual double balanced mixer 20 has a local oscillator input terminal LO for receiving a local oscillator signal, an RF input terminal RF for receiving an RF signal and an intermediate frequency output terminal IF for providing an intermediate frequency output signal. A mixer 25 has a pair of field effect transistors (FET). Mixer 25 has transistors Q1 and Q2. The field effect transistors are preferably metal oxide semiconductor field effect transistors (MOSFETS). The preferred field effect transistors are fabricated from ultra thin silicon in a CMOS process.

Transistor Q1 has a gate G1, a drain D1 and a source S1 electrodes. Transistor Q2 has a gate G2, a drain D2 and a source S2 electrodes. The source electrodes of transistors Q1 and Q2 are connected together and tied to ground G.

The gate electrodes of transistors Q1 and Q2 are connected to terminal LO through RF balun transformer TB. Balun transformer TB has wire windings W7 and W8 to form transformer T4. Wire windings W9 and WI0 form transformer T5. The windings are wound on a transformer core (not shown). Winding W7 has one end connected to node 27 and the other end connected to gate electrode Gl. Winding W8 has one end connected to ground and the other end connected to node 28. Winding W9 has one end connected to ground and the other end connected to node 27. Winding W10 has one end connected to node 28 and the other end connected to gate electrode G2. Terminal LO is connected to node 27 and to node 28 through an inductor L1. Inductor L1 has an end connected to node 28 and to ground G.

The drain electrodes D1 and D2 of transistors Q1 and Q2 are connected to terminals IF and RF through a transformer TA. Balun transformer TA has transformers T1, T2 and T3. Transformer TA has wire windings W1, W2, W3, W4, W5 and W6. Windings W1 and W2 form RF balun transformer T1. Windings W3 and W4 form IF balun transformer T2. Windings W4 and W5 form transformer T3. The windings are wound on a common transformer core (not shown). Winding W1 has one end connected to winding W3 and the other end connected to terminal RF. Winding W2 has one end connected to ground and the other end connected to winding W6. Winding W3 has one end connected to ground at node 21 and the other end connected to winding W1. Winding W4 has one end connected to terminal IF and the other end connected to drain electrode D1 at node 22. Winding W5 has one end connected to terminal IF and the other end connected to drain electrode D2 at node 23. Winding W6 has one end connected to ground at node 24 and the other end connected to winding W2.

Figure 2:
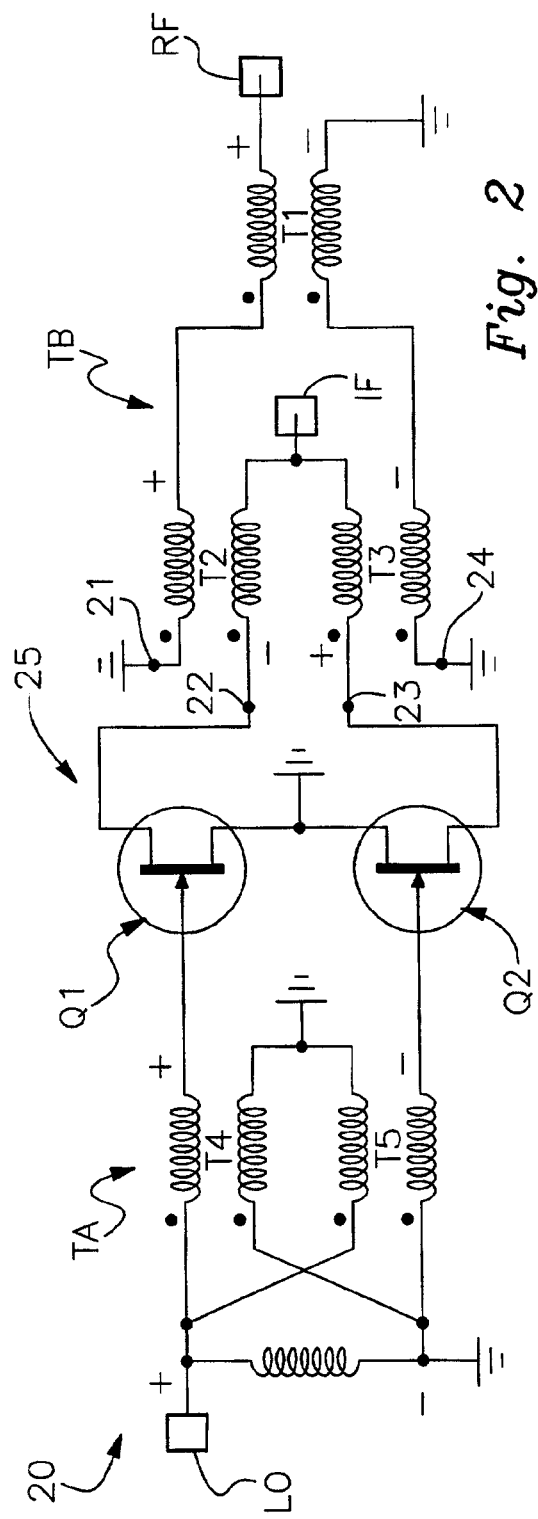
FIG. 2 shows the operation of the circuit of FIG. 1 when the local oscillator signal is positive.
Figure 3:
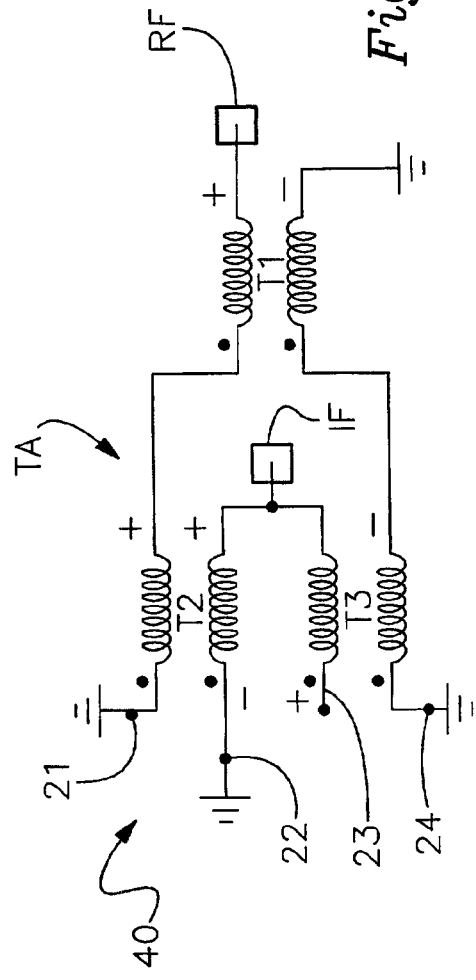
FIG. 3 shows an equivalent circuit of FIG. 2 when the local oscillator signal is positive.

Referring to FIG. 2, the operation of the circuit of FIG. 1 when the local oscillator signal is positive is shown. The polarity of the signal at the transformers is indicated by the plus (+) and minus (−) signs adjacent the windings. During the positive half of the LO signal, field effect transistor Q1 is on and Q2 is off. During the positive half of the LO signal, one end of transformer T2 at node 22 will be grounded through Q1 and one end of transformer T3 at node 23 will be open through Q2. This is represented by the equivalent circuit 40 shown in FIG. 3. The shorted source to drain connection is shown in FIG. 3 as well as the opened transformer T3. The signal polarities are also shown in FIG. 3.

Figure 4:
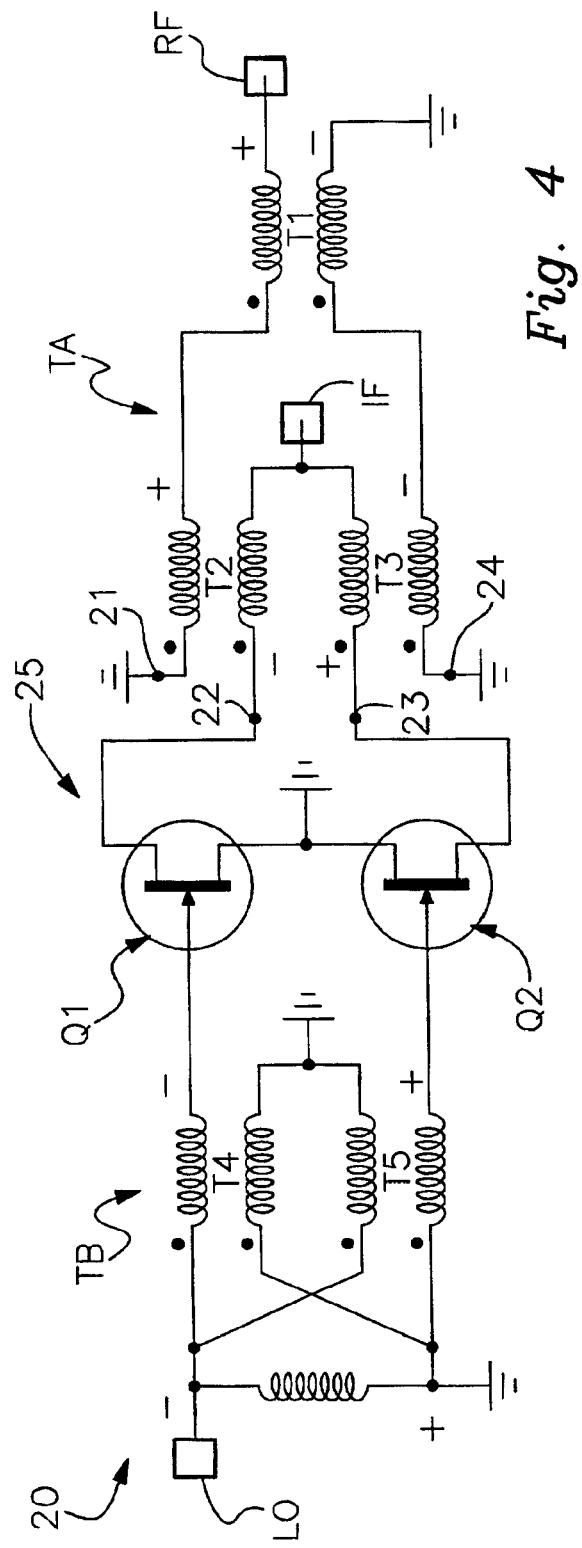
FIG. 4 shows the operation of the circuit of FIG. 1 when the local oscillator signal is negative.
Figure 5:
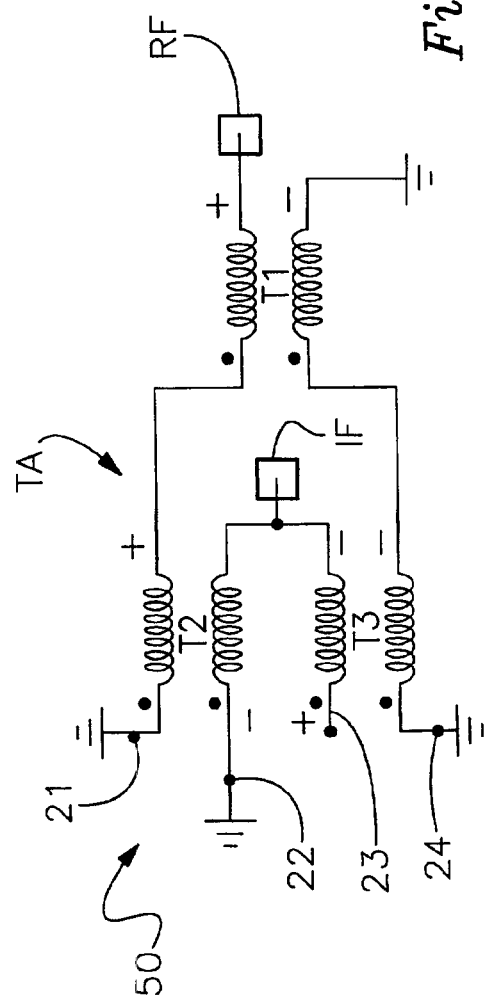
FIG. 5 shows an equivalent circuit of FIG. 4 when the local oscillator signal is negative.

FIG. 4 shows the operation of the circuit of FIG. 1 when the local oscillator signal is negative. The polarity of the signal at the transformers is indicated by the plus (+) and minus (−) signs adjacent the windings. During the negative half of the LO signal, field effect transistors Q1 is off and Q2 is turned on. Assuming for illustrative purposes that the RF signal is varying slowly, then during the negative half of the LO signal, one end of transformer T3 at node 23 will be grounded through Q2 and one end of transformer T2 at node 22 will be open through Q1. This is represented by the equivalent circuit 50 shown in FIG. 5. The shorted source to drain connection is shown in FIG. 5 as well as the opened transformer T2. The signal polarities are also shown in FIG. 5.

The result is that the RF signal at the IF port is reversed at the IF port every half cycle of the LO input signal. This is equivalent to mathematical multiplication of the RF and LO signals. This results in generation of sum and difference of LO and RF signals. The difference is normally used as the intermediate frequency (IF) signal. In the circuit of FIG. 1, there is a direct current (DC) path for the IF signal. Therefore, the IF frequency can go down to DC levels. IF response down to DC levels is important when a mixer is used in an in-phase quadrature (IQ) modulators. Transistors Q1 and Q2 are the only non-linear elements in the circuit of FIG. 1 that can generate inter-modulation products. The field effect transistors used for Q1 and Q2 are fabricated with an ultra thin CMOS technology that reduces inter-modulation products and provides high IP3.

Figure 6:
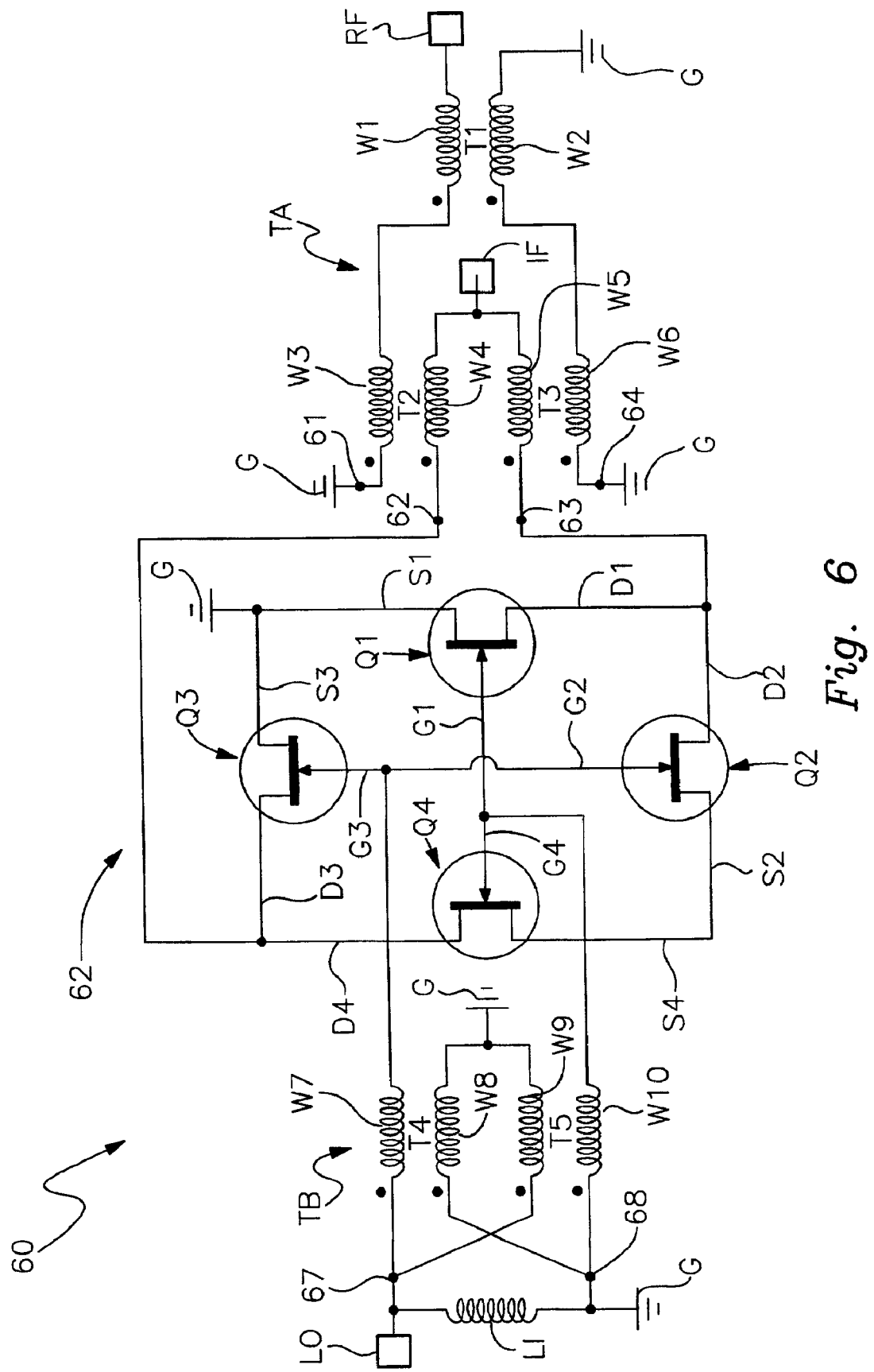
FIG. 6 is a schematic view of the preferred embodiment of a double balanced FET mixer using four FETs.

Referring to FIG. 6, a schematic view of the preferred embodiment of a Double Balanced Mixer 60 according to the present invention is shown. Mixer 60 is similar to mixer 20 except that four FET transistors are used. Dual double balanced mixer 60 has a local oscillator input terminal LO for receiving a local oscillator signal, an RF input terminal RF for receiving an RF signal and an intermediate frequency output terminal IF for providing an intermediate frequency output signal. A mixer 62 has a field effect transistor (FET) quad comprised of four FET transistors. Mixer 62 has transistors Q1, Q2, Q3 and Q4. The field effect transistors are preferably metal oxide semiconductor field effect transistors (MOSFETS). The preferred field effect transistors are fabricated from ultra thin silicon in a CMOS process.

Transistor Q1 has a gate G1, a drain D1 and source S1 electrodes. Transistor Q2 has a gate G2, a drain D2 and source S2 electrodes. Transistor Q3 has a gate G3, a drain D3 and source S3 electrodes. Transistor Q4 has a gate G4, a drain D4 and source S4 electrodes. The source electrodes S1 and S3 are connected together and tied to ground G. The source electrodes S2 and S4 are commoned together.

The gate electrodes of transistors Q1, Q2, Q3 and Q4 are connected to terminal LO through balun transformer TB. Balun transformer TB has wire windings W7 and W8 to form transformer T4. Wire windings W9 and W10 form transformer T5. The windings are wound on a transformer core (not shown). Winding W7 has one end connected to node 67 and the other end connected to a commoned point of gate electrodes G2 and G3. Winding W8 has one end connected to ground and the other end connected to node 68. Winding W9 has one end connected to ground and the other end connected to node 67. Winding W10 has one end connected to node 68 and the other end connected to a commoned point of gate electrodes G1 and G4. Terminal LO is connected to node 67 and to node 68 through an inductor L1. Inductor L1 has an end connected to node 68 and to ground G.

The drain electrodes D1, D2, D3 and D4 are connected to terminal IF and RF through a transformer TA. Balun transformer TA has transformers T1, T2 and T3. Transformer TA has wire windings W1, W2, W3, W4, W5 and W6. Windings W1 and W2 form transformer T1. Windings W3 and W4 form transformer T2. Windings W4 and W5 form transformer T3. The windings are wound on a common transformer core (not shown). Winding W1 has one end connected to winding W3 and the other end connected to terminal RF. Winding W2 has one end connected to ground and the other end connected to winding W6. Winding W3 has one end connected to ground at node 61 and the other end connected to winding W1. Winding W4 has one end connected to terminal IF and the other end connected to commoned drain electrodes D3 and D4 at node 62. Winding W5 has one end connected to terminal IF and the other end connected to commoned drain electrodes D1 and D2 at node 63. Winding W6 has one end connected to ground at node 64 and the other end connected to winding W2. The use of the four FET quad of FIG. 6 is less costly than the circuit shown in FIG. 1 as FET quads are more readily available commercially. The transformers can be implemented using ferrite transformers for low frequencies or using a transformer formed on a low temperature co-fired ceramic (LTCC) substrate for high RF and microwave frequencies.

The operation of the circuit of FIG. 6 is similar to that of FIG. 1. During the positive half of the LO signal, field effect transistors Q2 and Q3 are on and Q1 and Q4 are off. During the positive half of the LO signal, one end of transformer T2 at node 62 will be grounded through Q3 and one end of transformer T3 at node 63 will be open as Q1 and Q4 are off. During the negative half of the LO signal, field effect transistors Q2 and Q3 are off and Q1 and Q4 are on. One end of transformer T3 at node 63 will be grounded through Q1 and one end of transformer T2 at node 62 will be open as Q2 and Q3 are off. The result is that the RF signal at the IF port is reversed at the IF port every half cycle of the LO input signal. This is equivalent to mathematical multiplication of the RF and LO signals. This results in generation of sum and difference of LO and RF signals. The difference is normally used as the intermediate frequency (IF) signal. In the circuit of FIG. 6, there also is a direct current (DC) path for the IF signal. Therefore, the IF frequency can go down to DC levels.

Figure 7:
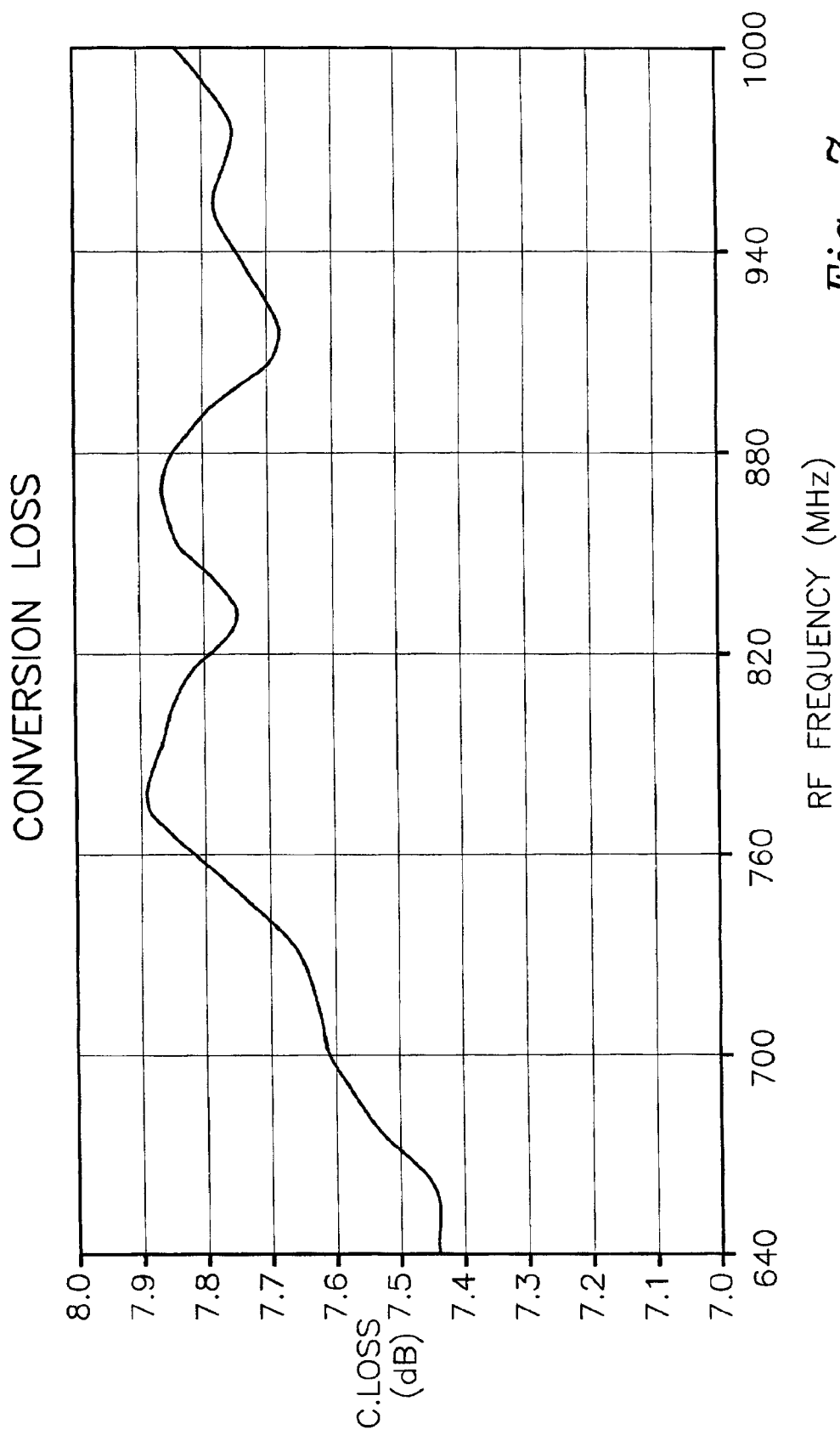
FIG. 7 is a graph of conversion loss versus frequency for the circuit of FIG. 6.

A mixer was built using the circuit of FIG. 6 with ferrite transformers. The mixer was designed to operate over the frequency range of 640 to 1000 MHz. Turning now to FIG. 7, a graph of conversion loss versus RF frequency for the circuit of FIG. 6 is shown. Conversion loss is a measure of the efficiency of the mixer in providing frequency translation between the RF signal and the IF signal. The conversion loss is 7.8 dB over most of the frequency band.

Figure 8:
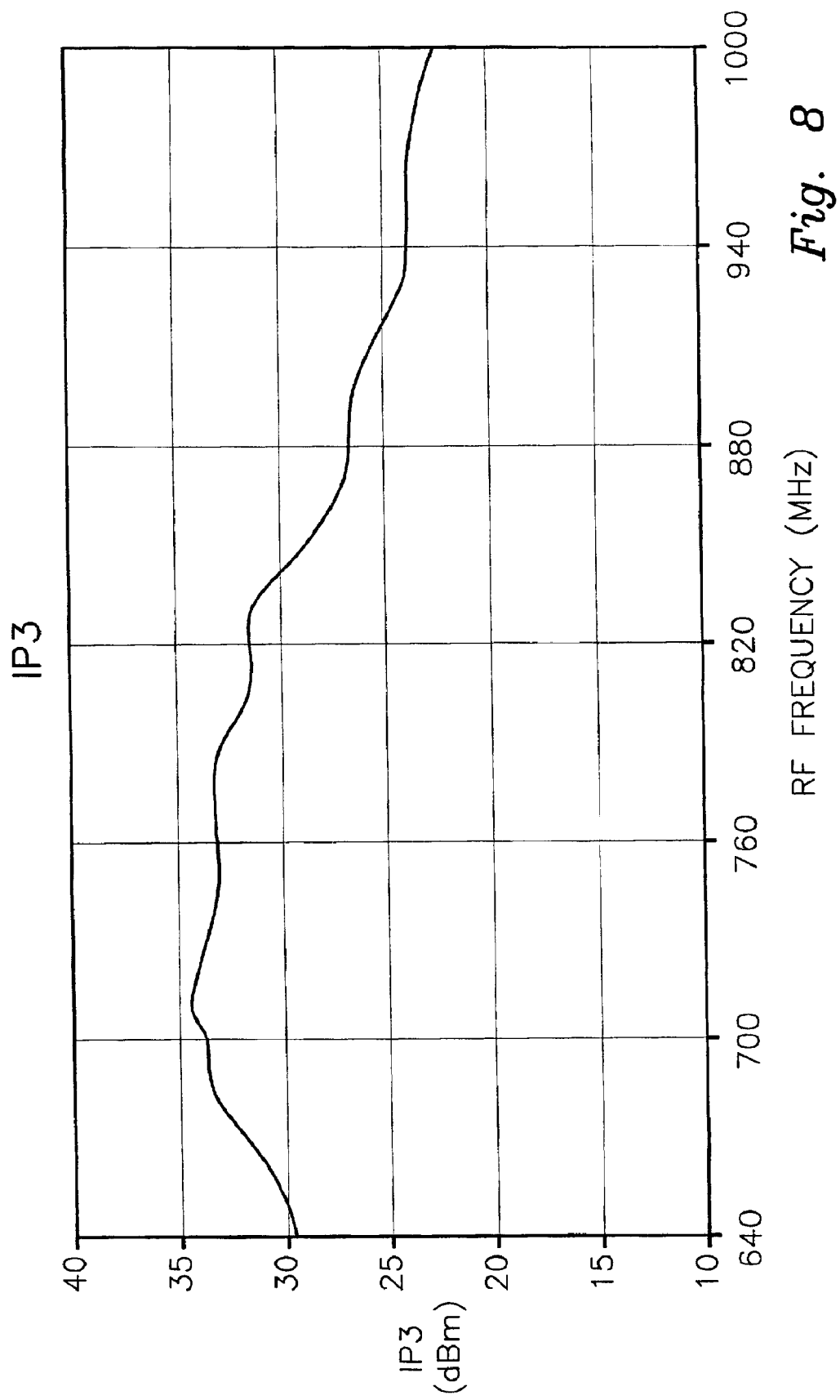
FIG. 8 is a graph of third order intercept point versus frequency for the circuit of FIG. 6.

Referring to FIG. 8, the effect of the circuit of FIG. 6 on third order intercept point (IP3) versus frequency is shown. A measured IP3 of 30 dBm was obtained between 650 and 820 MHz. This is a very good value of IP3 for a mixer with an IF response down to DC and for a mixer used in IQ modulators. Therefore, double balanced mixer 60 has a high IP3.

Figure 9:
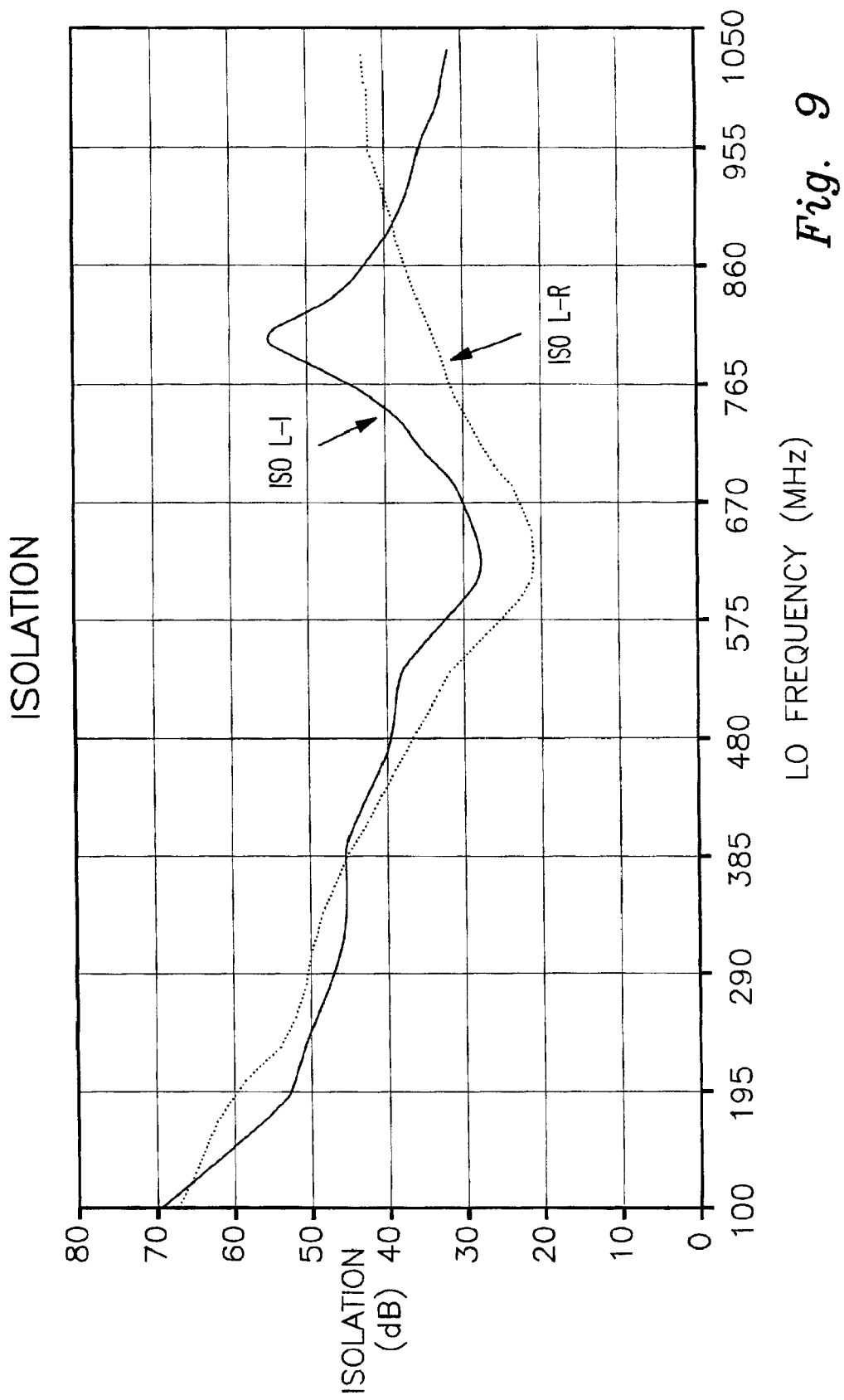
FIG. 9 is a graph of L-I and L-R isolation versus frequency for the circuit of FIG. 6.

FIG. 9 shows a graph of L-R and L-I isolation versus frequency for double balanced mixer 60. The effect of local oscillator LO leakage on the RF terminal is called L-R isolation. The effect of local oscillator LO leakage on the IF terminal is called L-I isolation. An L-R and L-I isolation typically of 20 to 40 dB over the operating frequency range was obtained.

Figure 10:
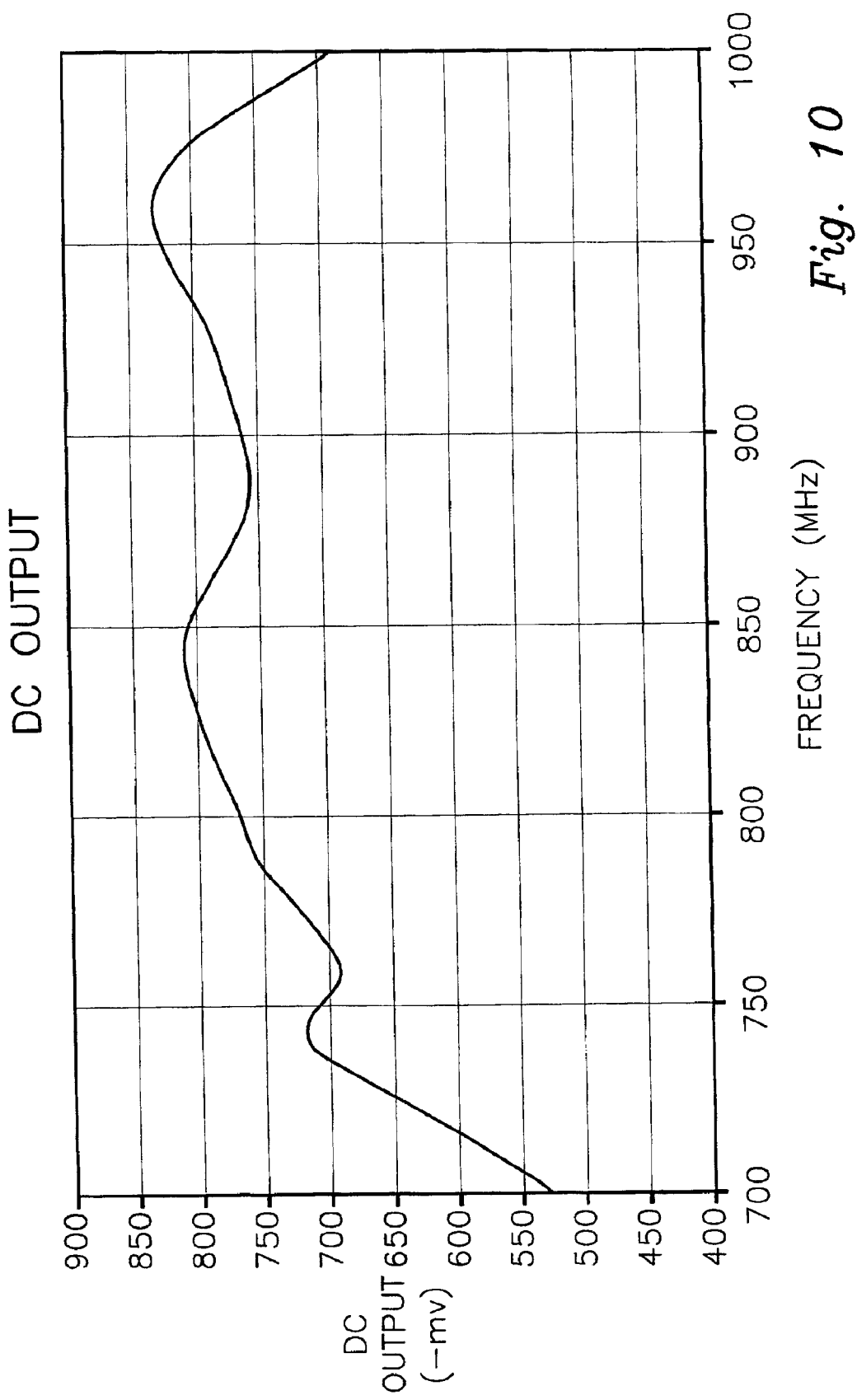
FIG. 10 is a graph of DC output versus frequency for the circuit of FIG. 6.

In FIG. 10, a graph of DC output versus frequency is shown for the circuit of FIG. 6. The graph shows that the DC output is greater than 700 mv between 730 to 970 Mhz. This value is better than the DC output that is obtainable with a diode mixer.

Figure 11:
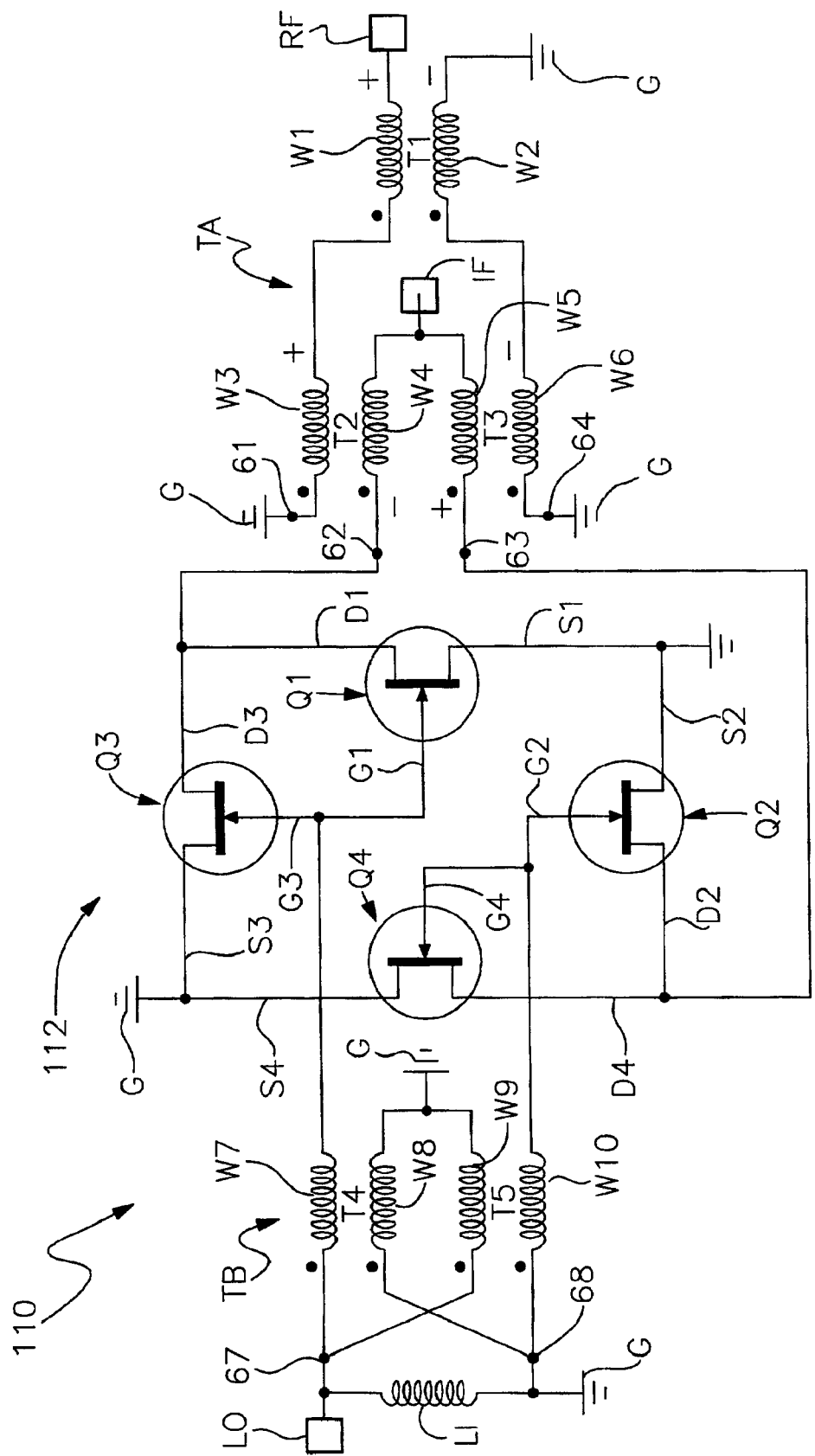
FIG. 11 is a schematic view of an alternative embodiment of a double balanced FET mixer using four FETs.

Referring to FIG. 11, a schematic view of an alternative embodiment of a Double Balanced Mixer 110 according to the present invention is shown. Mixer 110 is similar to mixer 60 except that the field effect transistors are connected in parallel. In mixer 110, the gates G1 and G3 are commoned as are the gates G2 and G4. Also, source electrodes S1 and S2 are commoned to ground as are source electrodes S3 and S4.

The operation of the circuit of FIG. 11 is similar to that of FIG. 6. During the positive half of the LO signal, field effect transistors Q1 and Q3 are on and Q2 and Q4 are off. This results in one end of transformer T2 at node 61 will be grounded through Q1 and Q3. One end of transformer T3 at node 63 is open as Q2 and Q4 are off. During the negative half of the LO signal, field effect transistors Q1 and Q3 are off and Q2 and Q4 are on. One end of transformer T3 at node 63 will be grounded through Q2 and Q4 and one end of transformer T2 at node 62 will be open as Q1 and Q3 are off. This is equivalent to the operation of FIG. 6 except that node 62 is grounded through two field effect transistors instead of one. This divides the RF power going to the FET's in half. The lower RF power results in an improvement in IP3 of 3 dB.

Figure 12:
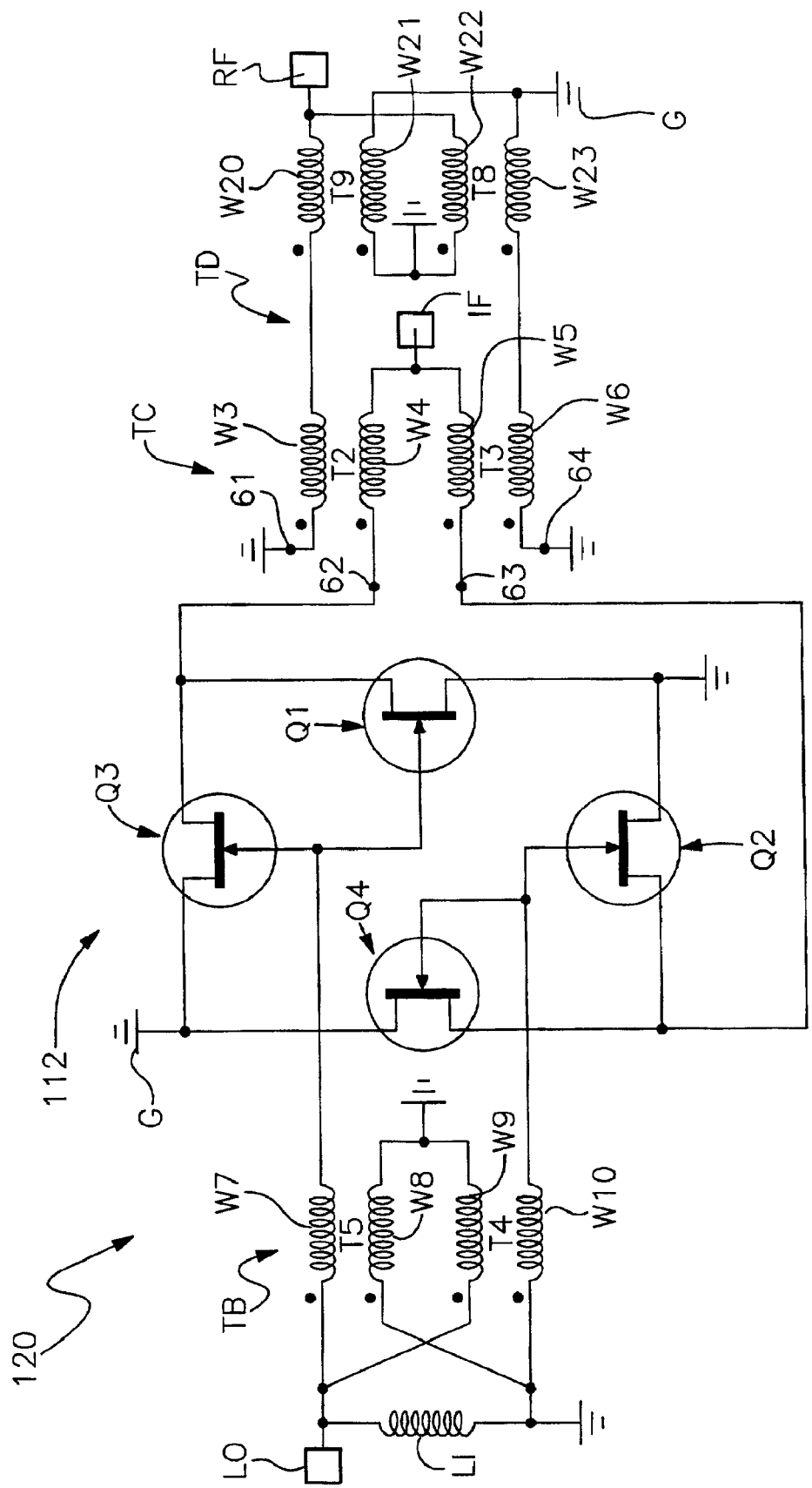
FIG. 12 is a schematic view of the circuit of FIG. 11 using an alternative RF balun.

Referring to FIG. 12, a schematic view of an another embodiment of a Double Balanced Mixer 120 according to the present invention is shown. Mixer 120 is similar to mixer 110 except that RF balun transformer T1 has been replaced with a separate 4 to 1 balun. The 4 to 1 balun provides a superior RF port match and still can provide an intermediate frequency response to DC. Mixer 120 has a separate balun transformers for the IF and RF terminals. IF Balun transformer TC has transformer T2 and T3 as in FIG. 6. RF balun transformer TD has transformers T8 and T9. Transformer T9 has windings W20 and W21. Winding W20 is connected between terminal RF and winding W3. Winding W21 is connected between ground at each end. Winding W22 is connected between ground and terminal RF. Winding W23 is connected between ground and winding W6. Transformers TC and TD have separate cores that their respective windings are wound on.

Figure 13:
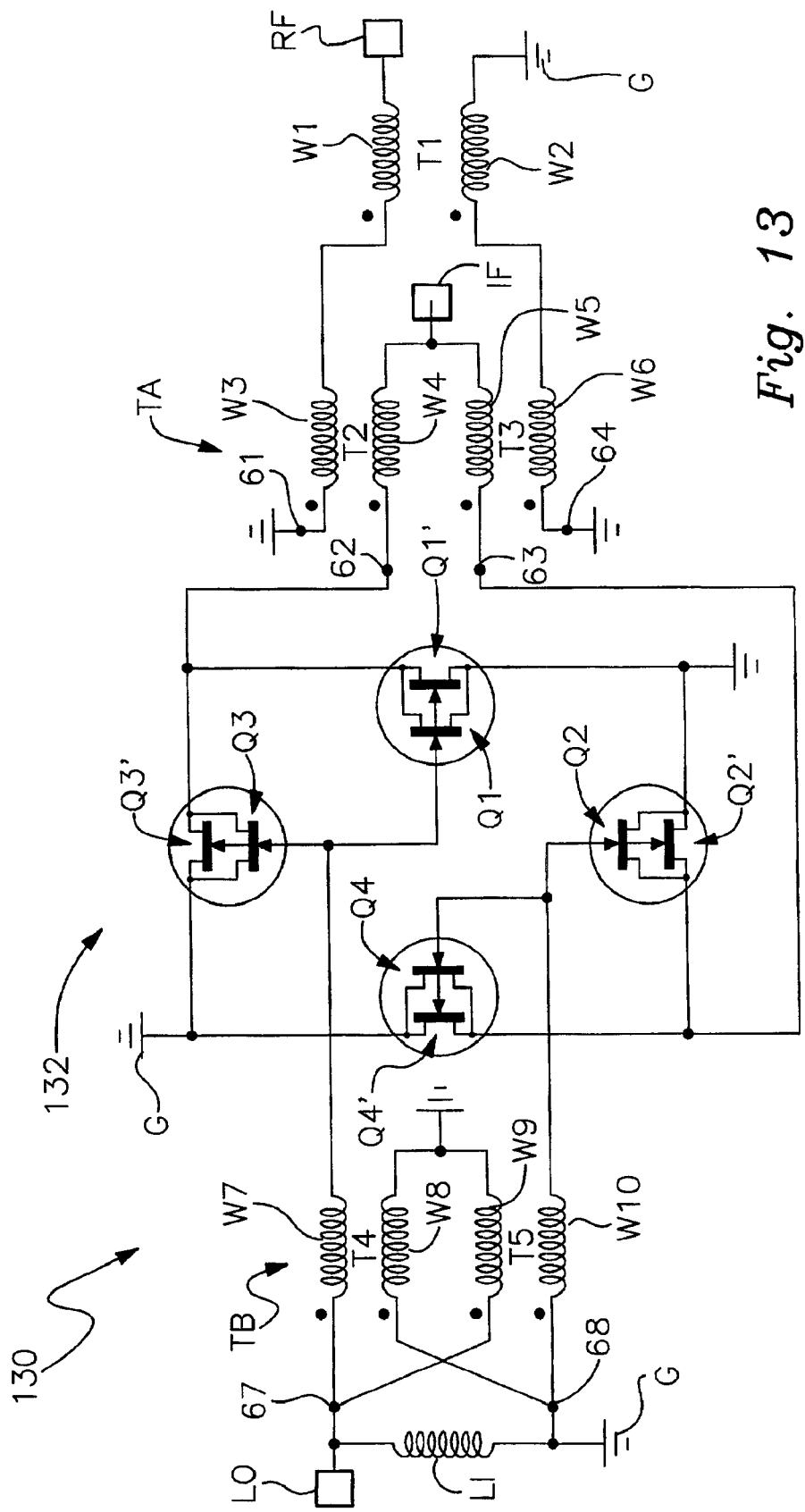
FIG. 13 is a schematic view of another embodiment of a double balanced FET mixer using additional FETs in parallel.

Referring to FIG. 13, a schematic view of an another embodiment of a Double Balanced Mixer 130 according to the present invention is shown. Double balanced mixer 130 is similar to mixer 110 except that four additional FET transistors Q1', Q2', Q3' and Q4' have been added in parallel to the original FET transistors Q1, Q2, Q3, and Q4. The new mixer is indicated by 132. The additional transistors improve IP3 because the power that each FET transistor handles is lowered. As the RF power level is lowered through each FET, the measured value of IP3 is improved.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A double balanced mixer for mixing an RF signal with a local oscillator signal to provide at an intermediate frequency signal comprising:
    a) a local oscillator terminal, an RF terminal and an intermediate frequency terminal;
    b) a first field effect transistor having a first gate, a first drain and a first source;
    c) a second field effect transistor having a second gate, a second drain and a second source, the first drain connected to the second drain;
    d) a third field effect transistor having a third gate, a third drain and a third source, the first source connected to the third source, the third gate connected to the second gate;
    e) a fourth field effect transistor having a fourth gate, a fourth drain and a fourth source, the third drain connected to the fourth drain, the second source connected to the fourth source, the first gate connected to the fourth gate;
    f) a local oscillator balun transformer connected between the local oscillator terminal and the junction of the first and fourth gates and the junction of the second and third gates;
    g) an intermediate frequency balun transformer connected between the junction of the first and second drains, the junction of the third and fourth drains and the intermediate frequency terminal; and
    h) a RF balun transformer coupled between the intermediate frequency balun transformer and the RF terminal.

2. The double balanced mixer according to claim 1 wherein the intermediate frequency balun transformer and the RE balun transformer are wound on a common core.

3. The double balanced mixer according to claim 1 wherein the intermediate frequency balun transformer and the RE balun transformer are wound on two separate cores.

4. The double balanced mixer according to claim 1 wherein the intermediate frequency response goes to direct current levels.

5. The double balanced mixer according to claim 1 wherein a fifth field effect transistor is connected in parallel with the first field effect transistor, a sixth field effect transistor is connected in parallel with the second field effect transistor, a seventh field effect transistor is connected in parallel with the third field effect transistor and an eighth field effect transistor is connected in parallel with the fourth field effect transistor.

6. The double balanced mixer according to claim 5 wherein the fifth, sixth, seventh and eighth field effect transistors carry a lower RF power resulting in a high value of IP3.

7. The double balanced mixer according to claim 1, further comprising:
    a) the local oscillator balun transformer having a first, second third and fourth winding;
    b) the first winding connected between a the junction of the second and third gate electrodes and the local oscillator terminal;
    c) the second winding connected between a ground and a junction of the fourth winding and the ground;
    d) the third winding connected between the ground and a junction of the first winding and the local oscillator terminal; and
    e) the fourth winding connected between the junction of the first and fourth gate electrodes and the local oscillator terminal.

8. The double balanced mixer according to claim 1, wherein an inductor is connected between the local oscillator terminal and a ground.

9. The double balanced mixer according to claim 1, further comprising:
    a) the intermediate frequency balun transformer having a first, second, third and fourth winding;
    b) the first winding connected between a ground and the RF terminal
    c) the second winding connected between the junction of the third drain and the fourth drain and the intermediate frequency terminal;
    d) the third winding connected between the junction of the first drain and the second drain and the intermediate frequency terminal; and
    e) the fourth winding connected between the ground and the RF terminal.

10. The double balanced mixer according to claim 1, further comprising:
    a) the RF balun transformer having a first and second winding;
    b) the first winding of the RF balun transformer connected between the first winding of the intermediate frequency balun and the RF terminal; and
    c) the second winding of the RF balun transformer connected between the fourth winding of the intermediate frequency balun and the RF terminal.

11. The double balanced mixer according to claim 1, wherein there is a DC path for the intermediate frequency signal.

12. A double balanced mixer having a local oscillator terminal for receiving a local oscillator signal, an RF terminal for receiving an RF signal and an intermediate frequency terminal for providing an intermediate frequency signal, the double balanced mixer comprising:
    a) a first pair of field effect transistors, the first pair of transistors including a first and second transistor, each field effect transistor having a gate, a drain and a source;
    b) a second pair of field effect transistors, the second pair of field effect transistors including a third and fourth transistor, each field effect transistor having a gate, a drain and a source;
    c) the gates of the first pair of field effect transistors connected together;
    d) the gates of the second pair of field effect transistors connected together;
    e) the drains of the first pair of field effect transistors connected together;

f) the drains of the second pair of field effect transistors connected together;

g) the sources of the first and third field effect transistors connected together and to ground;

h) the sources of the second and fourth field effect transistors connected together and to ground;

i) a local oscillator balun transformer connected between the local oscillator terminal and the gates of the first and second pairs of field effect transistors;

j) an intermediate frequency balun transformer connected between the intermediate frequency terminal and the drains of the first and second pairs of field effect transistors; and k) a RF balun transformer connected between the intermediate frequency balun transformer and the RF terminal.

13. The double bid mixer according to claim 12, further comprising:

a) a first, second, third and fourth winding forming the local oscillator balun transformer;

b) the first winding connected between the gates of the first pair of field effect transistors and the local oscillator terminal;

c) the second winding connected between a ground and the fourth winding;

d) the third winding connected between the ground and the first winding; and e) the fourth winding connected between the gates of the second pair of field effect transistors and the local oscillator terminal.

14. The double balanced mixer according to claim 12, further comprising:

a) a fifth, sixth, seventh and eighth winding forming the intermediate frequency balun transformer;

b) the fifth winding connected between a ground and the RF terminal;

c) the sixth winding connected between the drains of the first pair of field effect transistors and the intermediate frequency terminal;

d) the seventh winding connected between the drains of the second pair of field effect transistors and the intermediate frequency terminal; and e) the eighth winding connected between the ground and the RF terminal.

15. The double balanced mixer according to claim 12, further comprising:

a) a ninth and tenth winding forming the RF frequency balun transformer;

b) the ninth winding connected between the fifth winding and the RF terminal; and c) the tenth winding connected between the eighth winding and the RF terminal.

16. The double balanced mixer according to claim 12, wherein there is a DC path for the intermediate frequency signal.

17. The double balanced mixer according to claim 12, wherein the intermediate frequency balun transformer and the RF balun transformer are wound on a common core.

18. The double balanced mixer according to claim 13, wherein an inductor is connected between the local oscillator terminal and the fourth winding.

19. The double balanced mixer according to claim 12, wherein the mixer is used in an in-phase-quadrature modulator.

20. The double balanced mixer according to claim 12 wherein a fifth field effect transistor is connected in parallel with the first field effect transistor, a sixth field effect transistor is connected in parallel with the second field effect transistor, a seventh field effect transistor is connected in parallel with the third field effect transistor and an eighth field effect transistor is connected in parallel with the fourth field effect transistor.

21. The double balanced mixer according to claim 20 wherein the fifth, sixth, seventh and eighth field effect transistors carry a lower RF power resulting in a high value of IP3.

* * * * *